(12) United States Patent
Tanaka

(10) Patent No.: US 8,673,543 B2  
(45) Date of Patent: Mar. 18, 2014

(54) METHOD FOR MANUFACTURING SEMICONDUCTOR DEVICE

(75) Inventor: Toshihiko Tanaka, Kanagawa (JP)

(73) Assignee: Renesas Electronics Corporation, Kanagawa (JP)

(\*) Notice: Subject to any disclaimer, the term of this patent is extended or adjusted under 35 U.S.C. 154(b) by 323 days.

(21) Appl. No.: 12/812,435

(22) PCT Filed: Dec. 9, 2008

(86) PCT No.: PCT/JP2008/072306
§ 371 (c)(1),
(2), (4) Date: Jul. 9, 2010

(87) PCT Pub. No.: WO2009/087846
PCT Pub. Date: Jul. 16, 2009

(65) Prior Publication Data
US 2010/0285409 A1    Nov. 11, 2010

(30) Foreign Application Priority Data
Jan. 9, 2008    (JP) .................................. 2008-002041

(51) Int. Cl.
*G03F 7/20*    (2006.01)
(52) U.S. Cl.
USPC ........................................... 430/314
(58) Field of Classification Search
USPC .................... 430/311, 313, 315, 319, 314
See application file for complete search history.

(56) References Cited

U.S. PATENT DOCUMENTS

| 6,569,595 B1 | 5/2003 | Sato et al. |
| 6,670,106 B2 | 12/2003 | Fujio |
| 6,815,129 B1 * | 11/2004 | Bjorkholm et al. ............. 430/30 |
| 6,898,781 B2 | 5/2005 | Singh et al. |
| 7,642,145 B2 | 1/2010 | Fukuda et al. |

FOREIGN PATENT DOCUMENTS

| JP | 5-275302 | 10/1993 |
| JP | 2000-310863 | 11/2000 |
| JP | 2001-267230 | 9/2001 |
| JP | 2002-203780 | 7/2002 |
| JP | 2004-335873 | 11/2004 |
| JP | 2004-363371 | 12/2004 |
| WO | WO 2004/012012 A1 | 2/2004 |

OTHER PUBLICATIONS

Japanese Notification of Reasons for Refusal, with English Translation, issued in Japanese Patent Application No. 2009-548868, mailed Apr. 3, 2012.

*Primary Examiner* — Brittany Raymond
(74) *Attorney, Agent, or Firm* — McDermott Will & Emery LLP

(57) ABSTRACT

A reverse pattern is formed once by combining a negative exposure mask having a wiring pattern with a positive resist, and then a positive wiring pattern is formed by use of the reverse pattern. That is, a positive resist applied on a semiconductor substrate is exposed by use of the exposure mask having an opening part in a region corresponding to the wiring pattern, and then the exposed part is removed by development to form a resist pattern, thereby forming the wiring pattern in the region corresponding to the opening part of the resist pattern. Consequently, it is hardly affected by flare during EUV exposure, thereby fabricating a fine wiring pattern with higher exposure latitude.

6 Claims, 7 Drawing Sheets

(56) References Cited

U.S. PATENT DOCUMENTS

| | | |
|---|---|---|
| 2001/0033998 A1 | 10/2001 | Fujio |
| 2004/0091789 A1* | 5/2004 | Han et al. ............................ 430/5 |
| 2004/0265745 A1 | 12/2004 | Sho et al. |
| 2005/0287447 A1* | 12/2005 | Kamm et al. ...................... 430/5 |
| 2006/0105273 A1 | 5/2006 | Fukuda et al. |
| 2006/0292876 A1* | 12/2006 | Naito ............................. 438/689 |
| 2007/0128823 A1* | 6/2007 | Lee et al. ....................... 438/396 |
| 2007/0224809 A1* | 9/2007 | Yamano ......................... 438/670 |
| 2008/0108222 A1* | 5/2008 | Nam et al. ..................... 438/694 |

* cited by examiner

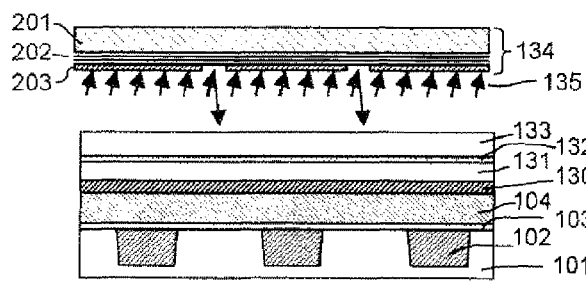
Fig. 3A
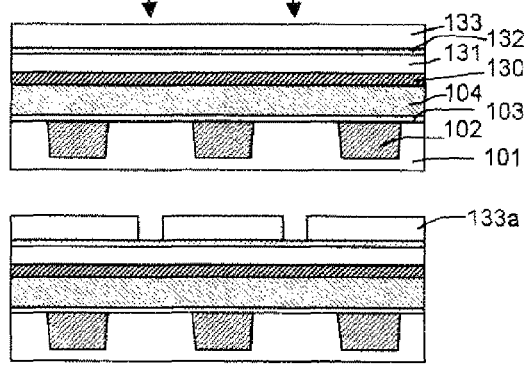
Fig. 3B
Fig. 3C
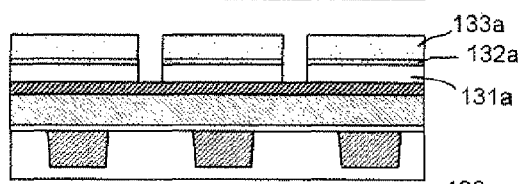
Fig. 3D
Fig. 3E
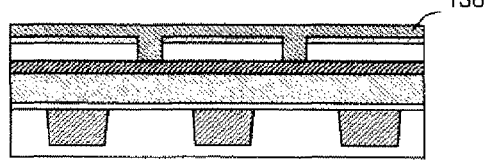
Fig. 3F
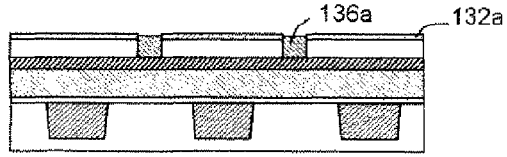
Fig. 3G
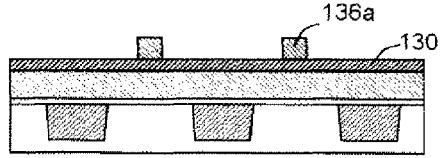
Fig. 3H
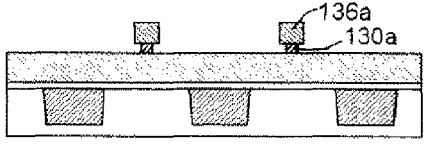
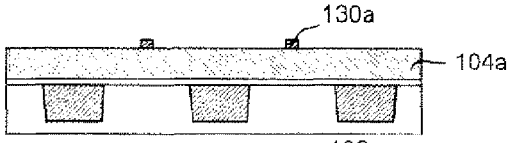
Fig. 3I
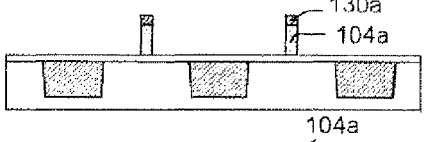
Fig. 3J
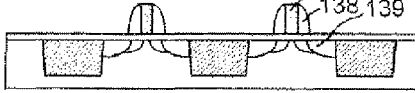

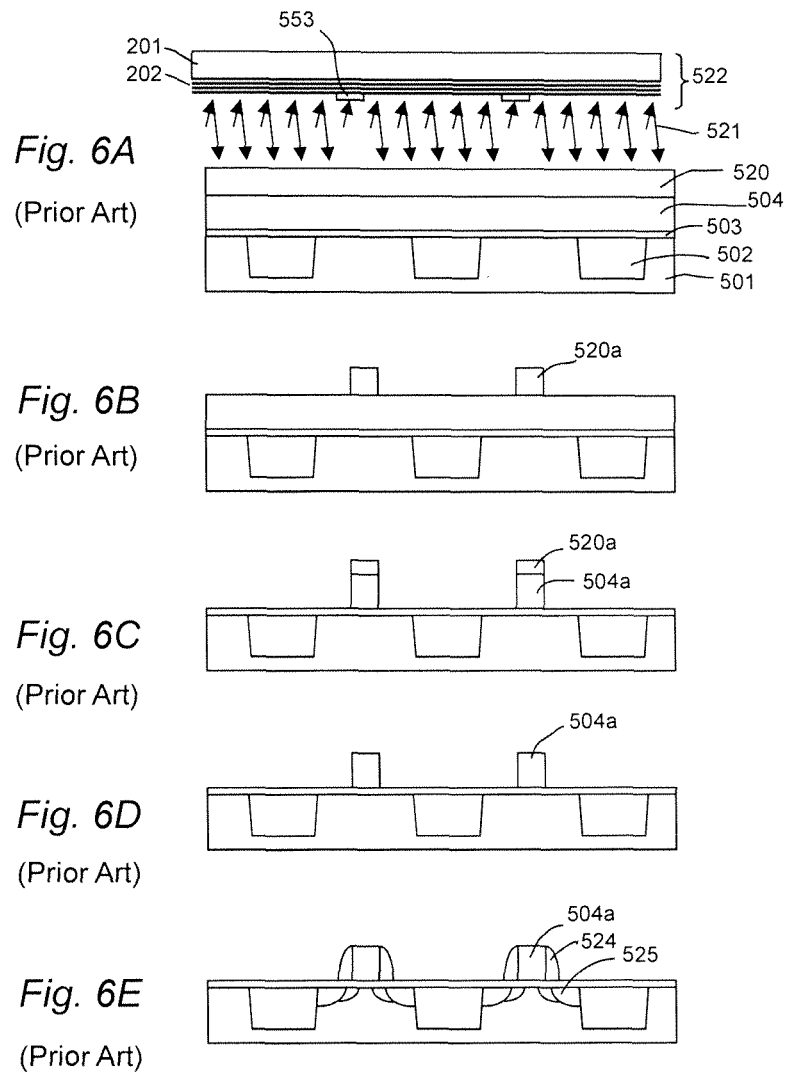

METHOD FOR MANUFACTURING SEMICONDUCTOR DEVICE

RELATED APPLICATIONS

This application is the U.S. National Phase under 35 U.S.C. §371 of International Application No. PCT/JP2008/072306, filed on Dec. 9, 2008, which in turn claims the benefit of Japanese Application No. 2008-002041, filed on Jan. 9, 2008, the disclosures of which Applications are incorporated by reference herein.

TECHNICAL FIELD

The present invention relates to a lithography technique used in manufacturing a semiconductor device such as semiconductor integrated circuit, more particularly, to a technique to fabricate a fine gate with a high degree of dimension accuracy.

BACKGROUND

The lithography technique is employed for a method of transferring a fine pattern onto a substrate during processes of manufacturing a semiconductor integrated circuit. A projection aligner is very often used in the lithography technique, wherein the pattern can be transferred by irradiating a resist formed on the substrate with exposure light transmitted through a photomask mounted on the projection aligner.

In recent years, it is increasingly demanded that the device be more densely integrated and an operation speed be increased, and researches for pattern miniaturization are under way to meet these demands. In order to meet these demands for miniaturization, an effort has been made to improve a resolution of a projected image by shortening a wavelength of the exposure light, and a study has been made on an exposing method using EUV (Extremely Ultra Violet) light having a wavelength of 13.5 nm which is one digit or more shorter than that of conventional ultraviolet light.

In the EUV lithography, since the wavelength of the exposure light is quite short and an optical system including a mask is of reflective type, there is problematic flare which can be a source of stray light caused by that the exposure light is scattered toward undesired directions. While the flare can be classified into several groups, an especially problematic one is what is called a local flare generated in the EUV lithography.

The local flare is generated by that the exposure light is irregularly reflected from a reflecting surface of a reflection mirror having a very small roughness, so that an undesired part is exposed. Such flare is likely to reduce an exposure contrast and an exposure latitude. In a case where a mount of flare is varied depending on a density of a peripheral pattern, there is a problem that dimension accuracy and geometry of the pattern may be distributed.

In order to solve this problematic flare, a method has been proposed to adjust the density of a pattern either by applying dimensional bias to a mask pattern depending on the density of the peripheral pattern or by arranging a dummy pattern around the pattern (See the following patent documents 1 and 2, for example).

[PATENT DOCUMENT 1] U.S. Pat. No. 6,815,129
[PATENT DOCUMENT 2] U.S. Pat. No. 6,898,781

DISCLOSURE OF THE INVENTION

Problem to be Solved by the Invention

FIG. 6A to FIG. 6E are explanatory views showing an example of a conventional method for manufacturing a semiconductor device. Here, this method employs combination of a positive exposure mask having a wiring pattern and a positive resist.

First, as shown in FIG. 6A, an isolation 502 for isolating respective elements is formed beforehand in a semiconductor substrate 501 formed of, e.g., Si (silicon). On the substrate 501, a gate oxide film 503, an electrically conductive film 504, and a positive resist 520 are sequentially formed.

Meanwhile, an exposure mask 522 having a gate wiring pattern is prepared beforehand. This exposure mask 522 is configured as a positive mask of the wiring pattern. A light shielding body 553 for blocking exposure light is provided in a region corresponding to the wiring pattern, and the remaining region other than the wiring pattern region functions as a reflecting surface.

Pattern exposure is performed by irradiating the positive resist 520 with the exposure light 521 using the exposure mask 522.

Next, as shown in FIG. 6B, the positive resist 520 is developed to remove the exposed part, thereby forming a resist pattern 520a.

Next, as shown in FIG. 6C, the conductive film 504 is subject to an etching process using the resist pattern 520a as an etching mask, thereby forming a wiring pattern 504a.

Next, as shown in FIG. 6D, after removing the resist pattern 520a, spacers 524 are formed on both sides of the wiring pattern 504a and diffusion layers 525 are formed in the substrate 501 using known arts, thereby forming a transistor element, a gate electrode, and a gate wiring.

FIG. 7 is a layout plan view showing an example of a gate pattern in an exposure mask used in the conventional method for manufacturing a semiconductor device. As shown in FIG. 7, a gate pattern part 51 includes a gate electrode of a transistor element and a gate wiring connected to the gate electrode. Especially in logic devices, a pattern density of the gate pattern part 51 is considerably smaller than that of a peripheral field part 52. In general, in most of logic devices, a pattern area of the gate pattern part 51 is 20% or less with respect to the total area.

When forming the gate pattern with a positive resist having a resolution higher than that of a negative resist, the fine gate pattern part 51 is covered with flare resulting from the field part 52 which occupies 80% or more of the total mask area, so that an exposure contrast is considerably lowered. At this time, the gate pattern part 51 serves as a light shielding part on the exposure mask to block the exposure light.

As a coverage level caused by the flare reaches 10% of the total amount of exposure, just applying dimensional bias to the mask pattern as mentioned in the patent documents 1 and 2 cannot ensure a high degree of dimensional accuracy as well as exposure latitude.

According to the conventional manufacturing method shown in FIG. 6, a flare level originating from the optical system itself of the exposure aligner is about 10% in general. When the area ratio of the field part 52 having the reflecting surface exposed on the exposure mask to be used is 85% with respect to the total mask area, 8.5% (=85%×10% (flare level of the optical system)) of stray light is generated, hence, to cover the resist pattern therewith. As a result, an edge cross-section of the resist pattern becomes an angle shape, so that the exposure latitude cannot be ensured.

FIG. 8 is a layout plan view showing an example of a gate pattern provided with an additional dummy pattern for anti-flare measures. The dummy pattern 61 is provided to surround the gate pattern part 51 with a predetermined gap from the gate pattern part 51, thereby reducing the area of the peripheral field part 62.

Even when such a dummy pattern 61 is arranged as shown in FIG. 8, a dummy pattern ratio as much as 50% of the total mask area is needed to ensure sufficient gate dimensional accuracy and sufficient exposure latitude, resulting in a problem that an unwanted wiring capacity increases in the device.

In order to solve the above problem specific to the dummy pattern, it can be envisioned to remove the dummy pattern which has been added during forming the gate pattern, by exposing and processing it again. However, the exposure and the processing have to be performed twice, thereby causing some problems of complicated process, increased cost and lowered yield.

It is an object of the present invention to provide a method for manufacturing a semiconductor device, which is capable of reducing an effect of flare generated at the time of exposing a mask, and forming a fine wiring pattern with a higher exposure latitude.

Means for Solving the Problem

According to an embodiment of the present invention, a reverse pattern is formed once by combining a negative exposure mask having a wiring pattern with a positive resist, and then a positive wiring pattern is formed by use of the reverse pattern. That is, a positive resist applied on a semiconductor substrate is exposed by use of the exposure mask having an opening part in a region corresponding to the wiring pattern, and then the exposed part is removed by development to form a resist pattern, thereby forming the wiring pattern in the region corresponding to the opening part of the resist pattern.

According to another embodiment of the present invention, a method for manufacturing a semiconductor device includes steps of: preparing an exposure mask having an opening part in a region corresponding to a wiring pattern; forming a wiring layer of a wiring material on a semiconductor substrate; forming a hard coating film of a hard coating material on the wiring layer; applying a positive resist onto the hard coating film; and exposing the positive resist using the exposure mask. The method further includes steps of: forming a resist pattern by developing the positive resist to remove an exposed part; patterning the hard coating film using the resist pattern; removing the resist pattern; and embedding a hard mask material in an opening part of the hard coating film to form a hard mask pattern having a reversed pattern of the resist pattern. The method further includes steps of: removing the hard coating film so as to leave the hard mask pattern; and patterning the wiring layer using the hard mask pattern to form the wiring pattern.

According to still another embodiment of the present invention, a method for manufacturing a semiconductor device includes steps of: preparing an exposure mask having an opening part in a region corresponding to a wiring pattern; forming a wiring layer of a wiring material on a semiconductor substrate; forming an etchable underlying film on the wiring layer; forming a hard coating film of a hard coating material on the underlying layer; and applying a positive resist onto the hard coating film. The method further includes steps of: exposing the positive resist using the exposure mask; forming a resist pattern by developing the positive resist to remove an exposed part; patterning the hard coating film using the resist pattern; removing the resist pattern; and embedding a hard mask material in an opening part of the hard coating film to form a hard mask pattern having a reversed pattern of the resist pattern. The method further includes steps of: removing the hard coating film so as to leave the hard mask pattern; etching the underlying layer using the hard mask pattern to form a second mask pattern having a line width smaller than that of the hard mask pattern; removing the hard mask pattern so as to leave the second mask pattern; and patterning the wiring layer using the second mask pattern to form the wiring pattern.

According to yet still another embodiment of the present invention, a method for manufacturing a semiconductor device includes steps of: preparing an exposure mask having an opening part in a region corresponding to a wiring pattern; forming a hard coating film of a hard coating material on a semiconductor substrate; applying a positive resist onto the hard coating film; and exposing the positive resist using the exposure mask. The method further includes steps of: forming a resist pattern by developing the positive resist to remove an exposed part; patterning the hard coating film using the resist pattern; removing the resist pattern; sequentially embedding an insulation film and a wiring pattern in an opening part of the hard coating film; and removing the hard coating film.

According to one aspect of the present invention, the wiring pattern preferably includes a gate electrode of a transistor element formed in the semiconductor substrate, and a gate wiring connected to the gate electrode.

In addition, the step of forming the hard mask pattern preferably includes chemical mechanical polishing (CMP).

In addition, the step of embedding the insulation film and the wiring pattern preferably includes chemical mechanical polishing.

In addition, the step of exposing the positive resist preferably employs EUV light.

In addition, the exposure mask is preferably a reflective type of mask having a reflecting surface for reflecting the exposure light in a region corresponding to the wiring pattern, and an absorbing surface for absorbing the exposure light in a region other than the above region.

Effect of the Invention

According to the embodiment, an effect of flare generated at the time of exposing a mask can be reduced, and a fine wiring pattern can be formed with high exposure latitude. As a result, a densely integrated semiconductor device can be produced with high yield.

BRIEF DESCRIPTION OF THE DRAWINGS

FIG. 3A to FIG. 3J are explanatory views showing another example of a method for manufacturing a semiconductor device, according to the present invention.

FIGS. 6A to FIG. 6E are explanatory views showing an example of a conventional method for manufacturing a semiconductor device.

Figure 1A:
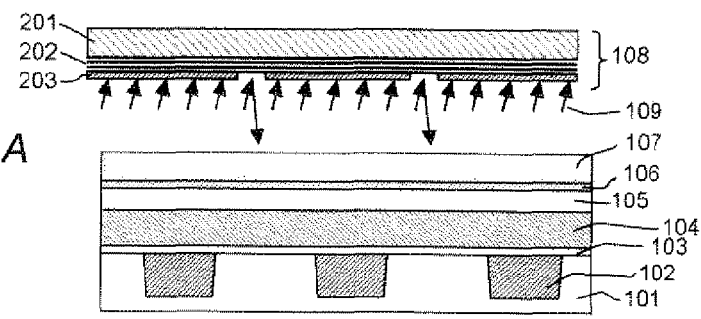
FIG. 1A to FIG. 1H are explanatory views showing an example of a method for manufacturing a semiconductor device, according to the present invention.

EXPLANATORY NOTE 71 wiring pattern part, 72 field part, 101 semiconductor substrate, 102 isolation, 103 gate oxide film, 104 electrically conductive film, 104a wiring pattern, 105, 106, 131, 132, 154, 150 hard coating film, 105a, 106a, 131a, 132a, 154a, 150a hard coating pattern, 107, 133, 151 positive resist, 107a, 133a, 151a resist pattern, 108, 134, 152 exposure mask, 109, 135, 153 exposure light, 110, 136 metal film, 110a, 136a hard mask pattern, 130 underlying film, 130a slimming mask pattern, 155 insulation film, 155a gate insulation film, 156 electrically conductive film, 156a gate wiring pattern, 201 mask substrate, 202 multilayer reflecting film, 203 absorbing body

BEST EMBODIMENT FOR CARRYING OUT THE INVENTION

Hereinafter, embodiments of the present invention will be described with reference to the drawings. In the drawings, the same reference is assigned to the same or corresponding part and description thereof is occasionally simplified or omitted.

Embodiment 1

FIG. 1A to FIG. 1H are explanatory views showing an example of a method for manufacturing a semiconductor device, according to the present invention. Here, they are partial cross-sectional views of a semiconductor integrated circuit in which a number of transistor elements (e.g., MOSFET) are formed in a semiconductor substrate, and a wiring pattern including a gate electrode of each element and a gate wiring connected to the gate electrode is formed thereon.

First, as shown in FIG. 1A, an isolation 102 for isolating respective elements is formed beforehand in a semiconductor substrate 101 formed of, e.g., Si (silicon). On the substrate 101, a gate oxide film 103, an electrically conductive film 104, hard coating films 105 and 106, and a positive resist 107 are sequentially formed.

The gate oxide film 103 can be formed of $SiO_2$ or a high-dielectric (high-k) material such as HfSiO (hafnium silicate), HfAlON (nitrogen added hafnium aluminate), $HfO_2$, or $Y_2O_3$. The conductive film 104 can be formed of polysilicon doped with an impurity. The hard coating film 105 can be formed of $SiO_2$ or the like. The hard coating film 106 can be formed of SiN, SiC, or SiCB. While two-layer structure including the hard coating films 105 and 106 is shown in this case, a single hard coating film or, three or more hard coating films can be also used.

Meanwhile, an exposure mask 108 having a gate wiring pattern is prepared beforehand.

Figure 2:
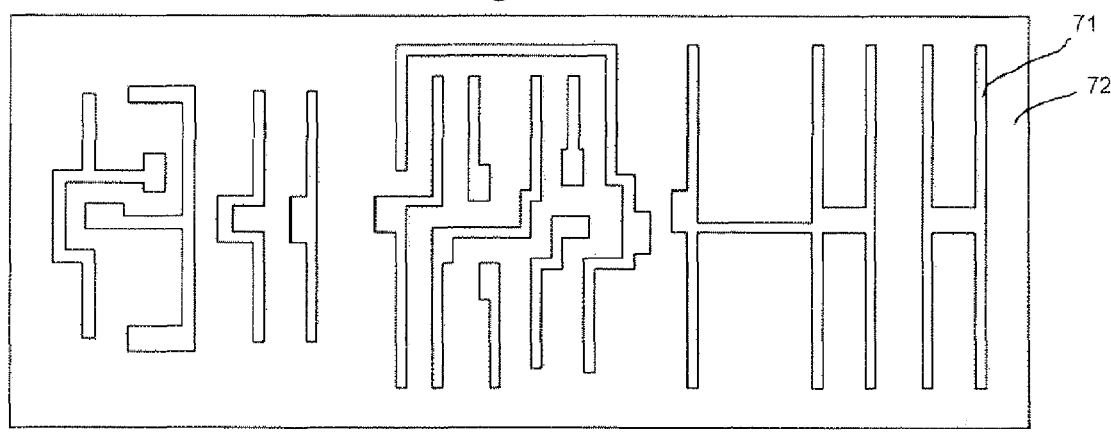
FIG. 2 is a plan view showing an example of an exposure mask according to the present invention.

FIG. 2 is a plan view showing an example of an exposure mask according to the present invention. The exposure mask 108 is configured as a negative mask of the wiring pattern, and has an opening part in a region corresponding to a wiring pattern part 71. An absorbing body for absorbing exposure light or a shielding body for blocking exposure light is formed in a field part 72 other than the opening part. In a case of using a transmissive mask, the exposure light can pass through the opening part, while in another case of using a reflective mask, the exposure light can be reflected from the opening part.

In this embodiment, the exposure mask as shown in FIG. 2 is used, and an area ratio of the wiring pattern part 71 having an exposed reflecting surface is about 15% with respect to the total area of the mask.

Referring back to FIG. 1A, using this exposure mask 108, pattern exposure is performed by irradiating the positive resist 107 with exposure light 109. For the exposure light 109, it is preferable to employ EUV light having a wavelength range of 10 nm to 15 nm, in particular, a wavelength of 13.5 nm. In this case, therefore, the exposure mask 108 is configured of a mask substrate 201, a multilayer reflecting film 202, and an absorbing body 203, as a reflective type of mask.

The mask substrate 201 can be formed of quartz glass or low thermal expansion glass (LTEM), etc. The multilayer reflecting film 202 can be formed of, e.g., a MoSi multilayer film having a sufficient reflectivity with respect to the EUV light (having a wavelength of 13.5 nm). The absorbing body 203 can be formed of a material, such as Ta, which can absorb or block the EUV light.

Incidentally, for purpose of facilitating inspection of the exposure mask 108, an interference film (not shown) may be provided on the absorbing body 203 to adjust the reflectivity with respect to mask pattern inspection light having a wavelength of 254 nm or 199 nm. In addition, a capping layer (not shown) having a function to prevent pollution and tolerate cleaning may be formed on the multilayer reflecting film 202, and this capping layer can be formed of Si or Ru. A conductive film (not shown) may be formed on a back side of the mask substrate 201 to allow electrostatic adsorption onto a mask stage of an exposure aligner.

In addition, although not shown, as a part of the exposure aligner, a plurality of reflective projection optical systems are interposed between the exposure mask 108 and the substrate 101, thereby a pattern of light corresponding to the opening part of the exposure mask 108 can be focused on the positive resist 107. Here, a flare level originating from the optical system itself of the exposure aligner is about 10% in general.

Incidentally, in a case of employing ArF laser light (having a wavelength of 193 nm) for the exposure light 108, the exposure light can pass through the hard coating films 105 and 106, such as silicon oxide film or silicon nitride film, thereby possibly causing multiple reflection and interference between these surfaces or interfaces and each interface of the substrate 101, the gate oxide film 103, and the conductive film 104. As a result, an exposure intensity distribution is fluctuated, and pattern formation accuracy could be lowered. Therefore, the material of the hard coating films 105 and 106 is limited to a material which cannot transmit the exposure light. Meanwhile, when employing the EUV light for the exposure light 108, the light has an advantage of hardly causing interface reflection, because of relationship in refractive index among the substrate 101, the gate oxide film 103, the conductive film 104, and the hard coating films 105 and 106.

Figure 1B:
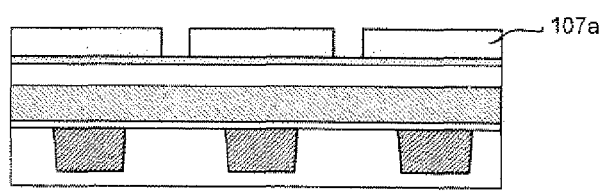
Figure 1C:
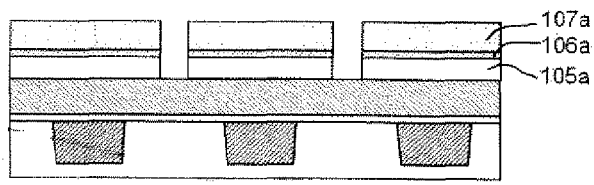

Next, as shown in FIG. 1B, the positive resist 107 is developed to remove the exposed part, thereby forming a resist pattern 107a. Next, as shown in FIG. 1C, the hard coating films 105 and 106 are patterned by etching, thereby forming hard coating patterns 105a and 106a. Then, the resist pattern 107a is removed.

Figure 1D:
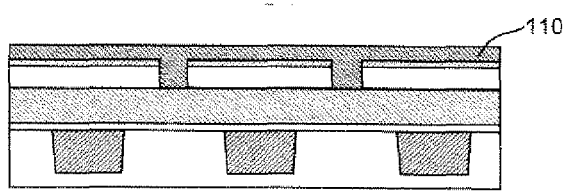

Next, as shown in FIG. 1D, a metal film 110 is formed on the upper surface and the opening part of the hard coating patterns 105a and 106a by sputtering or the like. The metal film 110 is formed of a hard mask material which can be used in etching the conductive film 104 of, e.g., polysilicon, and the hard mask material may be any material, such as W (tungsten), WN (tungsten nitride), WSi, Ti (titanium), TiN, TiW, Ta (tantalum), TaN, and Cu (copper), as long as it is suitable as a film to be subjected to a chemical mechanical polishing (CMP) as described below, and it does not become a pollution source in forming the transistor.

Figure 1E:
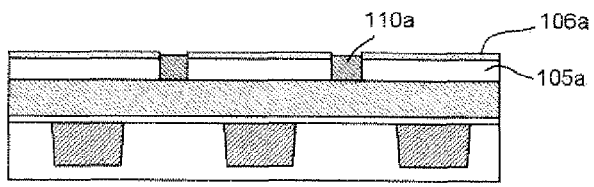

Next, the metal film 110 is subjected to chemical mechanical polishing (CMP) to remove the metal film 110 present on the upper surface of the hard coating patterns 105a and 106a, so that the metal film 110 is embedded only in the opening part, thereby forming a hard mask pattern 110a as shown in FIG. 1E. The hard mask pattern 110a has a reversed pattern of the resist pattern 107a. At this time of CMP, the hard coating pattern 106a serves as a CMP stopper and a CMP hard mask.

In general, CMP has a dishing problem, that is, a dished amount may fluctuate depending on size and density of the pattern, resulting in an uneven film thickness. But in this embodiment, such dishing is not problematic, as long as the metal film can serve as a hard mask in etching.

Figure 1F:
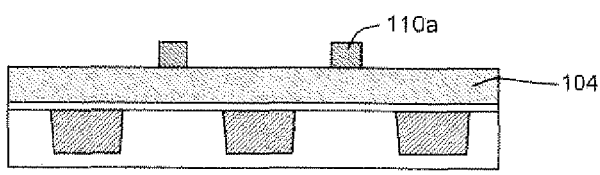

Next, as shown in FIG. 1F, the hard coating patterns 105a and 106a are removed by dry etching or the like so as to leave the hard mask pattern 110a.

Figure 1G:
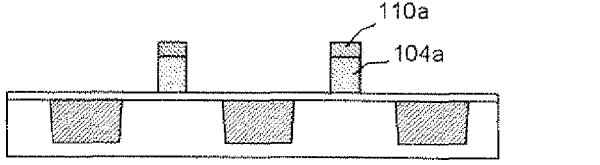

Next, as shown in FIG. 1G, the conductive film 104 is etched using the hard mask pattern 110a as an etching mask, thereby forming a wiring pattern 104a.

Figure 1H:
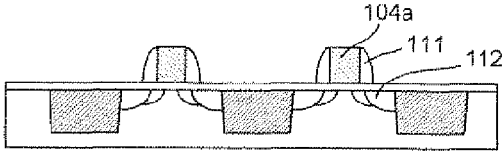

Next, as shown in FIG. 1H, after removing the hard mask pattern 110a, spacers 111 are formed on both sides of the wiring pattern 104a, and diffusion layers 112 are formed in the substrate 101 using known arts, thereby forming a transistor element, a gate electrode, and a gate wiring.

As described above, according to this embodiment, since the area irradiated with the exposure light for forming the gate layer is as small as about 15% of the total area, an amount of flare coverage in a gate pattern exposure part is as small as about 1.5% when using the EUV exposure light whose flare level from the reflective optical system is about 10%, so that sufficient resolution, a sufficient residual film thickness of the resist pattern, and sufficient exposure latitude can be ensured.

In this case, when a gate line width is 21 nm, for example, dose latitude of 10% or more, and focus latitude of ±100 nm can be ensure. In addition, as for a gate dimension which can vary depending on a gate pattern density, it can fall within desirable finished dimension accuracy (±5%) by applying dimensional bias to the mask pattern.

Figure 7:
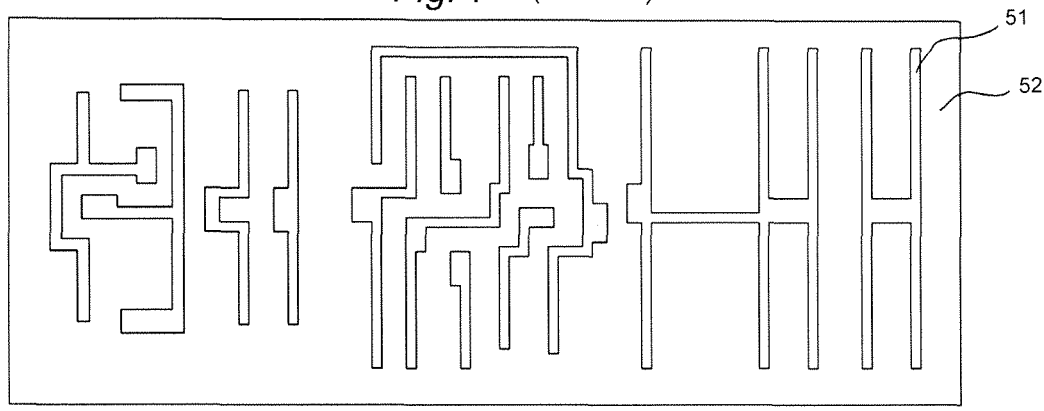
FIG. 7 is a layout plan view showing an example of a gate pattern in an exposure mask used in the conventional method for manufacturing a semiconductor device.
Figure 8:
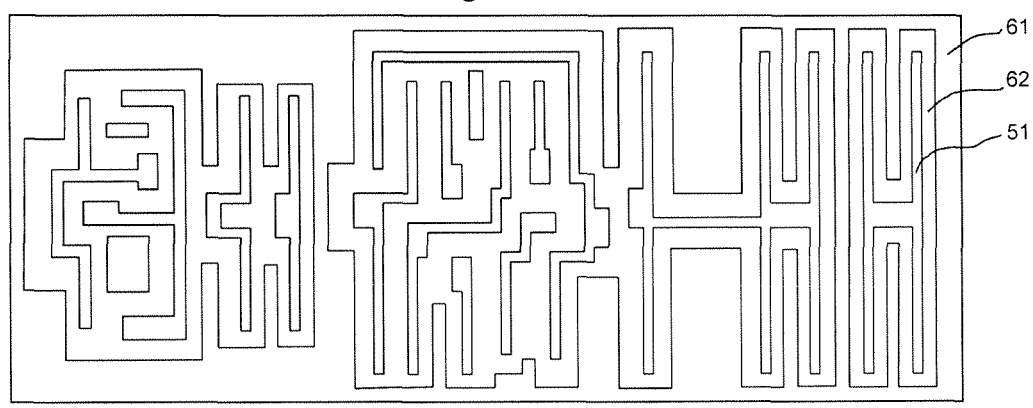
FIG. 8 is a layout plan view showing an example of a gate pattern provided with an additional dummy pattern for antiflare measures.

Meanwhile, according to the conventional method, since the exposure mask having an exposure region ratio of as high as 85% is used, as shown in FIG. 7, an amount of flare coverage in the gate pattern exposure part is as high as about 8.5%. For example, when the pattern has a width of 21 nm, the thickness of a resist film is reduced, and dose latitude is 3% or less, so that it is difficult to ensure desirable gate dimensional accuracy in the whole chip area.

The inventor demonstrated that after studying the relationship between the area irradiated with the exposure light for forming the gate layer and the exposure latitude, the gate dimensional accuracy of CD (critical dimension)±5% could be ensured when the irradiation area was 20% or less with respect to the total region.

In addition, the present invention is effective in terms of reduction in transfer defect. As for the reflective mask having a multilayer film, when a fine defect exists on the mask substrate before the multilayer film is formed, and a fine particle is mixed in or a fine void is generated during forming the multilayer, a phase defect is caused to create a pattern transfer defect. Especially, in the EUV lithography (EUVL), even a fine phase defect having a height of 2 nm or less and a width of 60 nm or less may become a source of transfer defect.

Also, it is not easy to inspect the phase defect of the multilayer film, and to make a mask blank having no phase defect, so that yield of defect-free blanks is lowered to increase mask cost. According to the conventional method using an exposure mask having a higher exposure ratio of the multilayer film surface and a larger exposed area, an incidence rate of mask defect is higher and the yield and cost are problematic.

Meanwhile, according to the method in the present invention using the exposure mask whose field part surface for the gate layer is formed of the absorbing body film instead of the multilayer film and having a lower exposure ratio of the multilayer film surface, even when the multilayer film has some phase defects, a large area of the multilayer film can be covered with the absorbing body, so that the number of transfer defect can be reduced, thereby considerably improving defect ratio and yield ratio. Especially, when the area occupied by the gate and the gate wiring is less than 50% with respect to the total region area, a considerable effect is recognized.

The inventor demonstrated that after studying the relationship among the flare level and the exposure latitude in an exposure aligner and the patterned dimension accuracy, under the condition that the flare level is 3.0% or less, when the area occupied by the gate and the gate wiring is 50% with respect to the total region area, an amount of flare coverage is as small as about 1.5%, so that the sufficient exposure latitude and patterned dimension accuracy can be achieved. The present invention is especially effective in that the area occupied by the gate and the gate wiring can be set to be less than 50% with respect to the total region area even when the flare level of the exposure aligner is 3.0% or more.

Embodiment 2

FIG. 3A to FIG. 3J are explanatory views showing another example of a method for manufacturing a semiconductor device, according to the present invention. Here, they are partial cross-sectional views of a semiconductor integrated circuit in which a number of transistor elements (e.g., MOSFET) are formed in a semiconductor substrate, and a wiring pattern including a gate electrode of each element and a gate wiring connected to the gate electrode is formed thereon.

According to this embodiment, a gate having an extremely thin line width is formed with a high degree of dimensional accuracy by performing a gate thinning process called slimming.

First, as shown in FIG. 3A, an isolation 102 for isolating respective elements is formed beforehand in a semiconductor substrate 101 formed of, e.g., Si (silicon). On the substrate 101, a gate oxide film 103, an electrically conductive film 104, an underlying film 130, hard coating films 131 and 132, and a positive resist 133 are sequentially formed.

The gate oxide film 103 can be formed on $SiO_2$ or a high-dielectric (high-k) material such as HfSiO, HfAlON, $HfO_2$, or $Y_2O_3$. The conductive film 104 can be formed of polysilicon doped with an impurity.

The underlying film 130 can be formed of an etchable material, such as an amorphous carbon film or a carbon film containing Si. The hard coating film 131 can be formed of $SiO_2$ or the like. The hard coating film 132 can be formed of SiN, SiC, or SiCB. While two-layer structure including the hard coating films 131 and 132 is shown in this case, a single hard coating film or, three or more hard coating films can be also used.

Meanwhile, an exposure mask 134 having a gate wiring pattern is prepared beforehand. This exposure mask 134 is configured as a negative mask of the wiring pattern and has an opening part in a region corresponding to the wiring pattern part 71, as shown in FIG. 2. An absorbing body for absorbing exposure light or a shielding body for blocking exposure light is formed in the field part 72 other than the opening part. In a case of using a transmissive mask, the exposure light can pass through the opening part, while in another case of using a reflective mask, the exposure light can be reflected from the opening part.

According to this embodiment, the exposure mask as shown in FIG. 2 is used, and an area ratio of the wiring pattern part 71 having an exposed reflecting surface is about 15% with respect to the total area of the mask.

Next, as shown in FIG. 3A, using this exposure mask 134, pattern exposure is performed by irradiating the positive resist 133 with exposure light 135. For the exposure light 135, it is preferable to employ EUV light having a wavelength range of 10 nm to 15 nm, in particular, a wavelength of 13.5 nm. In this case, therefore, the exposure mask 134 is configured of a mask substrate 201, a multilayer reflecting film 202, and an absorbing body 203, as a reflective type of mask.

The mask substrate 201 can be formed of quartz glass or low thermal expansion glass (LTEM). The multilayer reflecting film 202 can be formed of, e.g., a MoSi multilayer film having a sufficient reflectivity with respect to the EUV light (having a wavelength of 13.5 nm). The absorbing body 203 can be formed of a material, such as Ta, which can absorb or block the EUV light.

Incidentally, for purpose of facilitating inspection of the exposure mask 134, an interference film (not shown) may be provided on the absorbing body 203 to adjust the reflectivity with respect to mask pattern inspection light having a wavelength of 254 nm or 199 nm. In addition, a capping layer (not shown) having a function to prevent pollution and tolerate cleaning may be formed on the multilayer reflecting film 202, and this capping layer is formed of Si or Ru. A conductive film (not shown) may be formed on a back surface of the mask substrate 201 to allow electrostatic adsorption onto a mask stage of an exposure aligner.

In addition, although not shown, as a part of the exposure aligner, a plurality of reflective projection optical systems are interposed between the exposure mask 134 and the substrate 101, thereby a pattern of light corresponding to the opening part of the exposure mask 134 can be focused on the positive resist 133. Here, a flare level originating from the optical system itself of the exposure aligner is about 10% in general.

Next, as shown in FIG. 3B, the positive resist 133 is developed to remove the exposure part, thereby forming a resist pattern 133a. Next, as shown in FIG. 3C, the hard coating films 131 and 132 are patterned by etching, thereby forming hard coating patterns 131a and 132a. Then, the resist pattern 133a is removed.

Next, as shown in FIG. 3D, a metal film 136 is formed on the upper surface and the opening part of the hard coating patterns 131a and 132a by sputtering or the like. The metal film 136 is formed of a hard mask material which can be used in etching the conductive film 104 of, e.g., polysilicon, and the hard mask material may be any material, such as W (tungsten), WN (tungsten nitride), WSi, Ti (titanium), TiN, TiW, Ta (tantalum), TaN, and Cu (copper), as long as it is suitable as a film to be subjected to a chemical mechanical polishing (CMP), and it does not become a pollution source in forming the transistor.

In general, CMP has a dishing problem as described above. But in this embodiment, such dishing is not problematic, as long as the metal film can serve as a hard mask in etching.

Next, the metal film 136 is subjected to chemical mechanical polishing (CMP) to remove the metal film 136 present on the upper surface of the hard coating patterns 131a and 132a, so that the metal film 136 is embedded only in the opening part, thereby forming a hard mask pattern 136a, as shown in FIG. 3E. The hard mask pattern 136a has a reversed pattern of the resist pattern 133a. At this time of CMP, the hard coating pattern 132a serves as a CMP stopper and a CMP hard mask.

Next, as shown in FIG. 3F, the hard coating patterns 131a and 132a are removed by dry etching or the like so as to leave the hard mask pattern 136a.

Next, as shown in FIG. 3G, the underlying film 130 is etched by using the hard mask pattern 136a as an etching mask, thereby forming a slimming mask pattern 130a. At this time, the underlying film 130 is side-etched using dry etching with oxygen plasma to form the slimming mask pattern 130a having a line width smaller than that of the hard mask pattern 136a. For example, when a minimum dimension of the hard mask pattern 136a is set to 22 nm, a minimum line width of the sliming mask pattern 130a can be set to 18 nm.

Next, as shown in FIG. 3H, the hard mask pattern 136a is removed by etching or the like so as to leave the slimming mask pattern 130a.

Next, as shown in FIG. 3I, the conductive film 104 is etched using the slimming mask pattern 130a as an etching mask, thereby forming a wiring pattern 104a.

Next, as shown in FIG. 3J, after removing the slimming mask pattern 130a, spacers 138 are formed on both sides of the wiring pattern 104a, and diffusion layers 139 are formed in the substrate 101 by known arts, thereby forming a transistor element, a gate electrode, and a gate wiring. The minimum line width of the resultant gate electrode and the gate wiring is 18 nm, and its dimensional variation is as extremely excellent as ±1 nm.

Incidentally, a thinning process is applied here to etch the underlying film 130 by 4 nm with respect to each edge of the hard mask pattern 136a. Alternatively, once the underlying film 130 is etched to have the same line width as the hard mask pattern 136a, and then the hard mask pattern 136a is removed, and then the underlying film 130 is isotropically etched by 4 nm, thereby obtaining the slimming mask pattern 130a having a line width of 18 nm.

In particular, when the conductive film 104 formed of polysilicon is etched using the amorphous carbon film as an etching mask, carbon is supplied from the processed film at the time of etching, so that etching can be realized with lower dependency on roughness/fineness of the pattern and higher dimensional uniformity in plane.

Thus, according to this embodiment, once the reversed pattern is made by combining the negative exposure mask of the wiring pattern with the positive resist, and then the positive wiring pattern is formed using the reversed pattern, and then the gate thinning process called slimming is performed, thereby the gate having an extremely fine minimum line width such as 18 nm can be formed with a high degree of dimensional accuracy.

Embodiment 3

FIG. 4A to FIG. 4F are explanatory views showing still another example of a method for manufacturing a semiconductor device, according to the present invention. Here, they are partial cross-sectional views of a semiconductor integrated circuit in which a number of transistor elements (MOSFET, for example) are formed in a semiconductor substrate, and a wiring pattern including a gate electrode of each element and a gate wiring connected to the gate electrode is formed thereon.

According to this embodiment, once a reversed pattern is made by combining a negative exposure mask of a wiring pattern with a positive resist, and then a wiring pattern is formed in an opening part of the reversed pattern, thereby a gate having an extremely fine minimum line width can be formed with a high degree of dimensional accuracy.

Figure 4A:
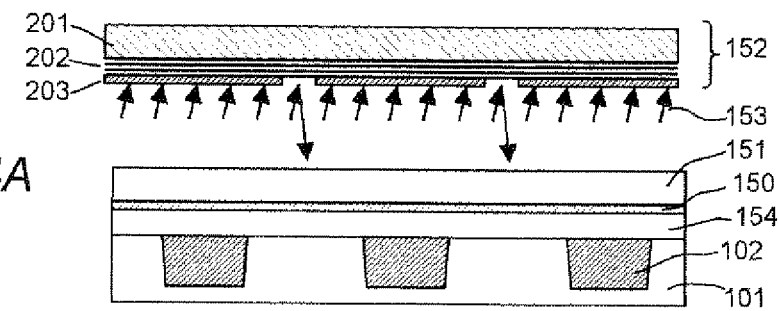
FIG. 4A to FIG. 4F are explanatory views showing still another example of a method for manufacturing a semiconductor device, according to the present invention.

First, as shown in FIG. 4A, an isolation 102 for isolating respective elements is formed beforehand in a semiconductor substrate 101 formed of, e.g., Si (silicon). On the substrate 101, hard coating films 154 and 150, and a positive resist 151 are sequentially formed.

The hard coating film 154 can be formed of SiO2 or the like. The hard coating film 150 can be formed of SiN, SiC, or SiCB. While two-layer structure including the hard coat films 154 and 150 is shown in this case, a single hard coating film or, three or more hard coating films can be also used.

Meanwhile, an exposure mask 152 having a gate wiring pattern is prepared beforehand. This exposure mask 152 is configured as a negative mask of the wiring pattern and has an opening part in a region corresponding to the wiring pattern part 71, as shown in FIG. 2. An absorbing body for absorbing exposure light or a shielding body for blocking exposure light is formed in the field part 72 other than the opening part. In a case of using a transmissive mask, the exposure light can pass through the opening part, while in another case of using a reflective mask, the exposure light can be reflected from the opening part.

According to this embodiment, the exposure mask as shown in FIG. 2 is used, and an area ratio of the wiring pattern part 71 having an exposed reflecting surface is about 15% with respect to the total area of the mask.

Next, as shown in FIG. 4A, using this exposure mask 152, pattern exposure is performed by irradiating the positive resist 151 with exposure light 153. As the exposure light 153, it is preferable to employ EUV light having a wavelength range of 10 nm to 15 nm, in particular, a wavelength of 13.5 nm. In this case, therefore, the exposure mask 152 is configured of a mask substrate 201, a multilayer reflecting film 202, and an absorbing body 203, as a reflective type of mask.

The mask substrate 201 can be formed of quartz glass or low thermal expansion glass (LTEM). The multilayer reflecting film 202 can be formed of, e.g., a MoSi multilayer film having a sufficient reflectivity with respect to the EUV light (having a wavelength of 13.5 nm). The absorbing body 203 can be formed of a material, such as Ta, which can absorb or block the EUV light.

Incidentally, for purpose of facilitating inspection of the exposure mask 152, an interference film (not shown) may be provided on the absorbing body 203 to adjust the reflectivity with respect to mask pattern inspection light having a wavelength of 254 nm or 199 nm. In addition, a capping layer (not shown) having a function to prevent pollution and tolerate cleaning may be formed on the multilayer reflecting film 202, and this capping layer is formed of Si or Ru. A conductive film (not shown) may be formed on a back surface of the mask substrate 201 to allow electrostatic adsorption onto a mask stage of an exposure aligner.

In addition, although not shown, as a part of the exposure aligner, a plurality of reflective projection optical systems are interposed between the exposure mask 152 and the substrate 101, thereby a pattern of light corresponding to the opening part of the exposure mask 152 can be focused on the positive resist 151. Here, a flare level originating from the optical system itself of the exposure aligner is about 10% in general.

Figure 4B:
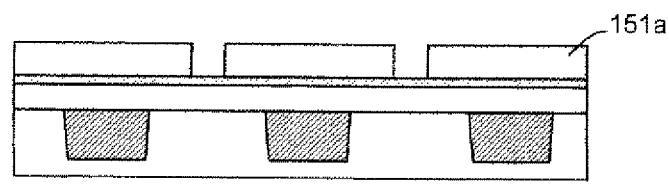
Figure 4C:
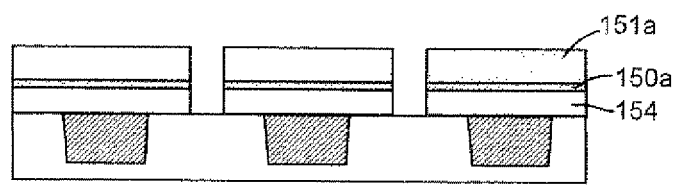

Next, as shown in FIG. 4B, the positive resist 151 is developed to remove the exposed part, thereby forming a resist pattern 151a. Next, as shown in FIG. 4C, the hard coating films 154 and 150 are patterned by etching, thereby forming hard coating patterns 154a and 150a. Then, the resist pattern 151a is removed.

Figure 4D:
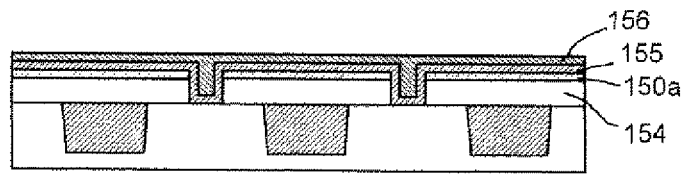

Next, after cleaning the surface of the substrate, as shown in FIG. 4D, an insulation film 155 and an electrically conductive film 156 are sequentially formed on the upper surface and in the opening part of the hard coating patterns 154a and 150a by CVD (Chemical Vapor Deposition) or sputtering, etc.

The insulation film 155 can be formed of SiO2 or a high-dielectric (high-k) material such as HfSiO, HfAlON, HfO2, or Y2O3. The conductive film 156 can be formed of a gate wiring material such as W (tungsten).

Figure 4E:
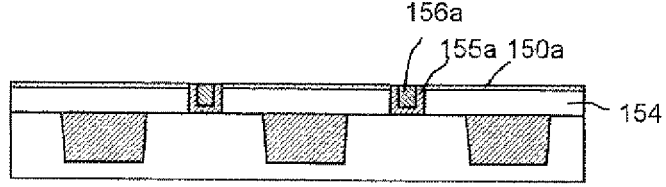

Next, the insulation film 155 and the conductive film 156 present on the upper surface of the hard coating patterns 154a and 150a are removed by chemical mechanical polishing (CMP), so that the insulation film 155 and the conductive film 156 are embedded only in the opening part, thereby forming a gate insulation film 155a and a gate mask pattern 156a, as shown in FIG. 4E. The gate wiring pattern 156a has a reversed pattern of the resist pattern 151a. At this time of CMP, the hard coating patterns 154a and 150a serve as a CMP stopper and a CMP hard mask.

Figure 4F:
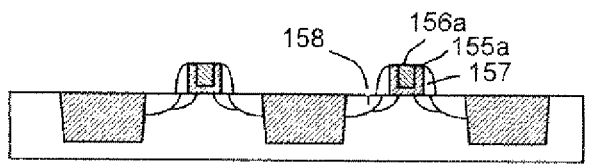

Next, as shown in FIG. 4F, the hard coating patterns 154a and 150a are removed by dry etching or the like so as to leave the gate insulation film 155a and the gate wiring pattern 156a. Next, spacers 157 are formed on both sides of the gate insulation film 155a and the gate wiring pattern 156a, and diffusion layers 158 are formed in the substrate 101 by known arts, thereby forming a transistor element, a gate electrode, and a gate wiring.

Thus, according to this embodiment, once the reversed pattern is made by combining the negative exposure mask of the wiring pattern with the positive resist, and then the wiring pattern is formed in the opening part of the reversed pattern, thereby the gate having an extremely fine minimum line width can be formed with a high degree of dimensional accuracy. Thus, even when an exposure aligner having a high level of flare is used, a high mobility transistor including, e.g., a metal gate and a high-k insulation film, can be formed with high degree of integration.

Embodiment 4

FIG. 5A to FIG. 5F are cross-sectional views explaining an example of a method for manufacturing a semiconductor integrated circuit. Illustrated here is a case of manufacturing semiconductor integrated circuits having a twin-well type CMIS (Complimentary MIS) circuit, but the present invention can be also applied to other various types of semiconductor integrated circuits.

A substrate 3s constituting a semiconductor wafer 3 is formed of, for example, disc-shaped n-type Si (silicon) single crystal. In an upper part of the substrate 3s, for example, an n-well 6n and a p-well 6p are formed (See FIG. 5B). The n-well 6n is implanted with, for example, an n-type impurity such as P (phosphorous) or As (arsenic). The p-well 6p is implanted with, for example, a p-type impurity such as B (boron). The n-well and the p-well are formed as follows.

First, a wafer alignment mark (not shown) for mask alignment is formed on the semiconductor substrate 3s. This wafer alignment mark may be also formed by adding a selective oxidation step at the time of forming the well.

Figures 5A, 5B, 5C, 5D, 5E, 5F:
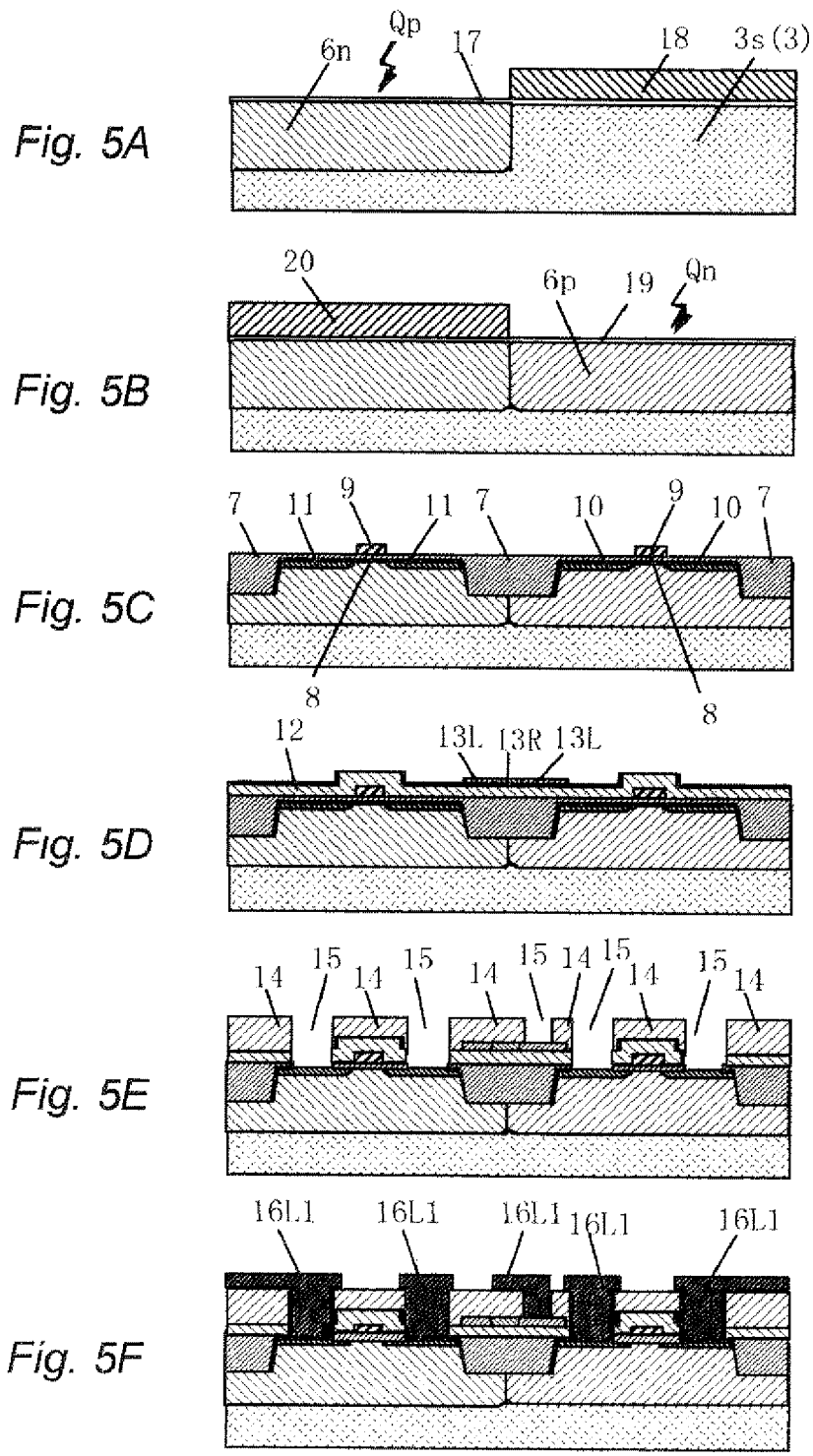
FIG. 5 is a cross-sectional view explaining an example of a method for manufacturing a semiconductor integrated circuit.

Then, as shown in FIG. 5A, an oxide film 17 is formed on the substrate 3s, and then a resist pattern 18 used for an ion implantation mask is formed on the oxide film 17 using optical lithography. Then, P (phosphorous) or As ions are implanted, thereby forming the n-type well 6n.

Next, the resist pattern 18 is removed by ashing process, and then the oxide film 17 is also removed, and then, as shown in FIG. 5B, an oxide film 19 is formed on the substrate 3s, and then a resist pattern 20 used for an ion implantation mask is formed on the oxide film 19 using optical lithography. Then, B (boron) ions are implanted, thereby forming the p-type well 6p.

Then, the resist pattern 20 is removed by ashing process, and then the oxide film 19 is also removed, and then, as shown in FIG. 5C, a field insulating film 7 for isolation is formed of, e.g., silicon oxide in a grooved isolation configuration on the upper main surface of the substrate 3s. For the method of isolation, LOCOS (Local Oxidization of Silicon) may be used.

In an active region surrounded by the field insulating film 7, an n-MIS transistor Qn and a p-MIS transistor Qp are formed. A gate insulation film 8 of each transistor is formed of, e.g., a high-k film.

In addition, each gate electrode 9 of the n-MIS transistor Qn and the p-MIS transistor Qp is formed by depositing a gate conductive film of, e.g., low-resistance polysilicon using CVD or the like and then etching it. In forming this gate, the manufacturing method according to the present invention can be applied.

A semiconductor region 10 of the n-MIS transistor Qn is formed in a self-aligned manner with respect to the gate electrode 9 by introducing, for example, P (phosphorus) or As into the substrate 3s with the gate electrode 9 used as a mask using ion implantation process or the like. Also, a semiconductor region 11 of the p-MIS transistor Qp is also formed in a self-aligned manner with respect to the gate electrode 9 by introducing, for example, B (boron) into the substrate 3s with the gate electrode 9 used as a mask using ion implantation process or the like.

Here, the gate electrode 9 is not limited to be formed of a single film of low-resistance polysilicon, and various changes may be made. For example, the gate electrode 9 may have a polycide structure in which a silicide layer including tungsten silicide, cobalt silicide or the like is formed on the low-resistance polysilicon film. Alternatively, the gate electrode 9 may have a polymetallic structure in which a barrier conductor film including titanium nitride, tungsten nitride or the like is formed on the low-resistance polysilicon film, and a metal film including tungsten or the like is further formed thereon.

Next, as shown in FIG. 5D, an interlayer insulation film 12 of silicon oxide film is deposited on the substrate 3s using, e.g., CVD process, and then a polysilicon film for interconnection is deposited on an upper surface of the interlayer insulation film 12 using CVD process or the like. Then, lithography is performed on the polysilicon film, and then the polysilicon film is patterned by etching, and then an impurity is implanted into a predetermined region of the patterned polysilicon film, thereby forming a wiring 13L and a resistor 13R of the polysilicon film.

Next, as shown in FIG. 5E, a silicon oxide film 14 is deposited over the substrate 3s using, e.g., CVD process. Then, a resist pattern is formed using EUV lithography for the interlayer insulating film 12 and the silicon oxide film 14, and then contact holes 15 are formed using etching process to partially expose the semiconductor regions 10 and 11 and the interconnection 13L.

Next, as shown in FIG. 5F, metal films made of Ti (titanium), TiN, and W (tungsten) are sequentially deposited on the substrate 3s using, e.g., sputtering process or CVD process, and then a resist is formed on these metal films using EUV lithography, and then etched so that a first interconnect layer 16L1 is formed. After that, a second interconnect layer (not shown) can be formed similarly to the first interconnect layer 16L1, thereby producing a final product.

In the above description, an example is given of a case where the present invention is applied to the CMIS circuit. The above-mentioned logic circuit has a low area ratio of the gate pattern 9. Therefore, the area ratio of the field part at the time of forming the gate pattern is relatively high, so that it is likely to be affected by flare originating from the exposure optical system. To solve this problem, the gate pattern is formed by employing the manufacturing method according to the present invention, so that it is hardly affected by the flare at the time of EUV exposure, thereby fabricating the gate with higher exposure latitude and higher dimensional accuracy.

INDUSTRIAL APPLICABILITY

The present invention is very useful in industrial applicability in that a semiconductor device having a fine and highly accurate pattern can be manufactured with high production efficiency.

The invention claimed is:

1. A method for manufacturing a semiconductor device having a wiring pattern on a semiconductor substrate, including steps of:
    preparing an exposure mask having an opening part in a region corresponding to the wiring pattern;
    forming a hard coating film of a hard coating material on the semiconductor substrate;
    applying a positive resist onto the hard coating film;
    exposing the positive resist using the exposure mask;
    forming a resist pattern by developing the positive resist to remove an exposed part;
    patterning the hard coating film using the resist pattern;
    removing the resist pattern;
    sequentially embedding an insulation film and a wiring pattern in an opening part of the hard coating film; and
    removing the hard coating film,
    wherein the step of exposing the positive resist employs EUV light, and
    wherein the exposure mask is a reflective type of mask having a reflecting surface for reflecting the exposure light in the region corresponding to the wiring pattern, and an absorbing surface for absorbing the exposure light in a region other than the above region,
    wherein the area occupied by the reflecting surface of the exposure mask is less than 20% with respect to the total region area of the exposure mask, and
    wherein a flare level of the exposure aligner used for exposure is equal to or higher than 3% and lower than 8%.

2. The method according to claim 1, wherein the wiring pattern includes a gate electrode of a transistor element formed in the semiconductor substrate, and a gate wiring connected to the gate electrode.

3. The method according to claim 1, wherein the step of embedding the insulation film and the wiring pattern includes chemical mechanical polishing.

4. The method according to claim 1, wherein the exposure mask of wiring pattern has no dummy pattern for anti-flare measures.

5. The method according to claim 1, wherein in the step of embedding an insulation film, the insulation film covers a bottom and sidewalls of the opening part.

6. The method according to claim 1, wherein the insulation film comprises $SiO_2$, HfSiO, HfAlON, $HfO_2$, or $Y_2O_3$.

* * * * *